United States Patent
Runas et al.

(10) Patent No.: US 8,482,333 B2
(45) Date of Patent: Jul. 9, 2013

(54) REDUCED VOLTAGE SWING CLOCK DISTRIBUTION

(75) Inventors: Michael E. Runas, McKinney, TX (US); James S. Blomgren, Austin, TX (US)

(73) Assignee: Apple Inc., Cupertino, CA (US)

( * ) Notice: Subject to any disclaimer, the term of this patent is extended or adjusted under 35 U.S.C. 154(b) by 80 days.

(21) Appl. No.: 13/274,662

(22) Filed: Oct. 17, 2011

(65) Prior Publication Data
US 2013/0093485 A1  Apr. 18, 2013

(51) Int. Cl.
*H03K 3/01* (2006.01)
(52) U.S. Cl.
USPC ............ 327/291; 327/295; 327/165; 327/259
(58) Field of Classification Search
None
See application file for complete search history.

(56) References Cited

U.S. PATENT DOCUMENTS

| | | | |
|---|---|---|---|
| 5,850,157 | A | 12/1998 | Zhu et al. |
| 6,066,965 | A | 5/2000 | Blomgren |
| 6,590,423 | B1 | 7/2003 | Wong |
| 7,268,633 | B2 | 9/2007 | von Kaenel |
| 7,395,286 | B1 | 7/2008 | Koh et al. |
| 7,598,774 | B2 | 10/2009 | Belluomini et al. |
| 7,729,459 | B1 * | 6/2010 | Kang et al. ............... 375/354 |
| 7,782,126 | B2 | 8/2010 | Cagno et al. |
| 2010/0052743 | A1 | 3/2010 | Kamizuma et al. |
| 2010/0117703 | A1 | 5/2010 | Zhu et al. |
| 2011/0140753 | A1 | 6/2011 | Papaefthymiou et al. |

OTHER PUBLICATIONS

Stroud; "Anatomy of a Flip-Flop ELEC 4200 Set-Reset (SR) Latch;" Auburn University, Aug. 2006.
U.S. Appl. No. 13/454,830, entitled "Method for Testing Integrated Circuits with Hysteresis", by Anh T. Hoang, Brian S. Park and Patrick D. McNamara, filed Apr. 24, 2012. 30 pages.

* cited by examiner

*Primary Examiner* — An Luu
(74) *Attorney, Agent, or Firm* — Rory D. Rankin; Meyertons, Hood, Kivlin, Kowert & Goetzel, P.C.

(57) ABSTRACT

A system and method for reducing power consumption within clock distribution on a semiconductor chip. A 4-phase clock generator within a clock distribution network provides 4 non-overlapping clock signals dependent upon a received input clock. A reduced voltage swing clock generator receives the non-overlapping clock signals and charges and discharges a second set of clock lines in a manner sequenced by the non-overlapping clock signals. The sequencing prevents a voltage range from reaching a magnitude equal to a power supply voltage for each of the second set of clock lines. In one embodiment, the magnitude reaches half of the power supply voltage. The reduced voltage swing latch receives the second set of clock lines. The reduced voltage swing latch updates and maintains logical state based at least upon the received second set of clock lines.

25 Claims, 10 Drawing Sheets

REDUCED VOLTAGE SWING CLOCK DISTRIBUTION

BACKGROUND OF THE INVENTION

1. Field of the Invention

This invention relates to computing systems, and more particularly, to reducing power consumption within clock distribution on a semiconductor chip.

2. Description of the Relevant Art

Geometric dimensions of devices and metal routes on each generation of semiconductor processor cores are decreasing. Therefore, more functionality is provided within a given area of on-die real estate. As a result, mobile devices, such as laptop computers, tablet computers, smart phones, video cameras, and the like, have increasing popularity. Typically, these mobile devices receive electrical power from a battery. Since batteries have a limited capacity, they are periodically connected to an external charger to be recharged. A vital issue for these mobile devices is power consumption. As power consumption increases, battery life for these devices is reduced and the frequency of recharging increases.

Different power modes supported by a processor core may disable portions of the chip during periods of non-use. This technique may reduce a number of switching nodes and load capacitance being switched. However, associated control logic may become complex and occupy a significant portion of the on-die real estate. Further, multiple executing applications on a mobile device may prevent sufficient disabling to significantly reduce power consumption. Reducing transistor sizes may also reduce an amount of switching capacitance. However, a limit is reached when the transistors already have the minimum available channel width. In addition, leakage current may increase with decreased transistor sizes.

Reducing the operational voltage, V, to decrease power consumption also reduces the amount of current that may flow through a transistor. Thus, the propagation delays increase through transistors. If the threshold voltages are reduced in order to turn-on the transistors sooner and aid in maintaining performance, then transistor current leakage increases, which increases power consumption. A large fraction of the total power consumption may be due to a clock distribution network. In some cases, this large fraction may be as much as half or more of the total power consumption. One or more clock signals are routed to sequential elements and memory structures across the entire die. As these clock signals toggle, buffers within the clock distribution network transition output states, consuming power in the process. Reducing the operational frequency, f, for the chip also reduces the performance of the circuits on the chip. Therefore, this reduction is generally not desirable.

In view of the above, efficient methods and mechanisms for reducing power consumption within clock distribution on a semiconductor chip are desired.

SUMMARY OF EMBODIMENTS OF THE INVENTION

Systems and methods for reducing power consumption within clock distribution on a semiconductor chip. In one embodiment, a reduced voltage swing clock distribution network on a semiconductor chip includes a multi-phase clock generator, a reduced voltage swing clock generator and a reduced voltage swing latch. The multi-phase clock generator provides multiple non-overlapping clock signals dependent upon a received input clock. In one embodiment, each of the non-overlapping clock signals has a same frequency and half of the duty cycle of the input clock. The reduced voltage swing clock generator receives the non-overlapping clock signals and charges and discharges a second set of clock lines in a manner sequenced by the non-overlapping clock signals. The sequencing prevents a voltage range to reach a magnitude equal to a power supply voltage for each of the second set of clock lines. In one embodiment, the magnitude reaches approximately half of the power supply voltage. The reduced voltage swing latch receives the second set of clock lines. The reduced voltage swing latch updates and maintains logical state based at least upon the received second set of clock lines.

These and other embodiments will be further appreciated upon reference to the following description and drawings.

Figure 1:
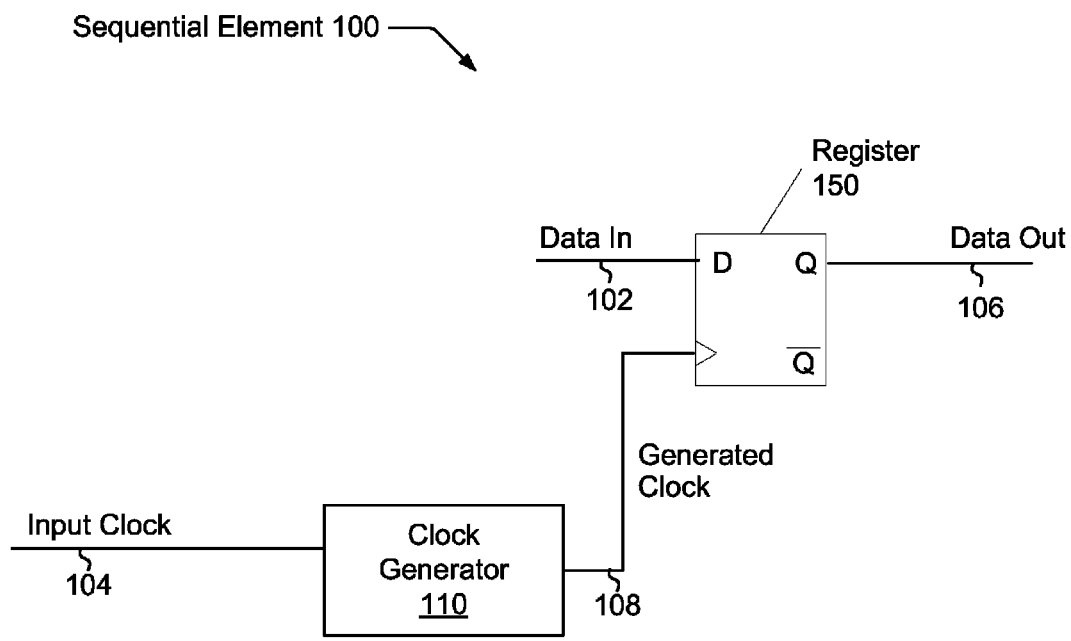
FIG. 1 is a generalized block diagram of one embodiment of a sequential element.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring to FIG. 1, a generalized block diagram illustrating one embodiment of a sequential element 100 is shown. As shown, the sequential element 100 includes a clock generator 110 and a storage element, such as register 150. In one embodiment, the register 150 is a latch storage element. In another embodiment, the register 150 is a flip-flop circuit used as a storage element. In yet another embodiment, the register 150 is a six-transistor (6T) random access memory (RAM) cell used as a storage element. Other implementations of a storage element for register 150 are possible and contemplated. The line Data In 102 receives a data input signal. The line Input Clock 104 receives a clock signal. The register 150 conveys an output value on the Data Out line 106 dependent upon at least a value on the Data In line 102 and an edge or a level of the clock signal on the Input Clock line 104. As used herein, level refers to a voltage level of an associated signal.

An output value on the Data Out line 106 may be sent to combinatorial logic, dynamic logic, another sequential element, and so forth. The sequential element 100 may be used in a variety of embodiments. For example, an apparatus or integrated circuit (IC) including such an element may include a clock distribution network and circuitry. The circuitry may perform a variety of functions such as arithmetic operations, memory access operations, data storage, data conversion, and so forth. The circuitry may perform such functions while using clock signals generated by a clock distribution network that includes the generator 110. In various embodiments, the circuitry may include the register 150 and/or generator 110. Alternatively, the clock distribution network may provide a clock signal to the circuitry. An integrated circuit (IC) may use the sequential element 100. The IC may be any of a variety of IC designs such as a processor, an application specific integrated circuit (ASIC), a core within a processor, an embedded system such as a system-on-a-chip (SOC), a graphics processing unit (GPU), a synchronous memory and so forth. Numerous such embodiments are possible and are contemplated.

Although not shown, the register 150 may include double output lines, feedback circuitry for the input, and scan circuitry. The clock generator 110 may receive a clock signal on the Input Clock line 104 and send a clock signal on the Generated Clock line 108. Although not shown, the clock generator 110 may receive other control signals to affect the signal on the Generated Clock line 108. For example, the clock generator 110 may receive a clock enable signal. Alternatively, clock gating may occur in logic upstream from the clock generator 110 and/or within the register 150.

In one embodiment, the register 150 is a latch. A positive-level latch may be transparent when the received clock signal on the Generated Clock line 108 has a binary high logic value. When the latch is transparent, it transmits values from the Data In line 102 to the Data Out line 106. When the received clock signal on the Generated Clock line 108 has a binary logic low value, this type of latch is opaque and no data transmission from line 102 to line 106 occurs. For a negative-level latch, the reverse scenario occurs.

In another embodiment, the register 150 is a flip-flop including a master-slave configuration. The master latch and slave latch receive inverted clock signals respective of one another. With a positive-edge triggered embodiment, a master latch is transparent and allows data transmission when the received clock signal on the Generated Clock line 108 has a logic low value. The slave latch is opaque, or closed, during this time and no data transmission to the Data Out line 106 occurs. When the clock signal on the Generated Clock line 108 transitions to a logic high value, the master latch closes and the slave latch opens and becomes transparent allowing data transmission. For a negative-edge triggered flip-flop, the reverse scenario occurs. The register 150 may include pass-gates, or transmission gates, to implement one or more latches. Alternative embodiments may include other transistor topologies such as sense amps, C2MOS topology, dynamic circuits, differential inputs, and other design choices.

Figure 2:
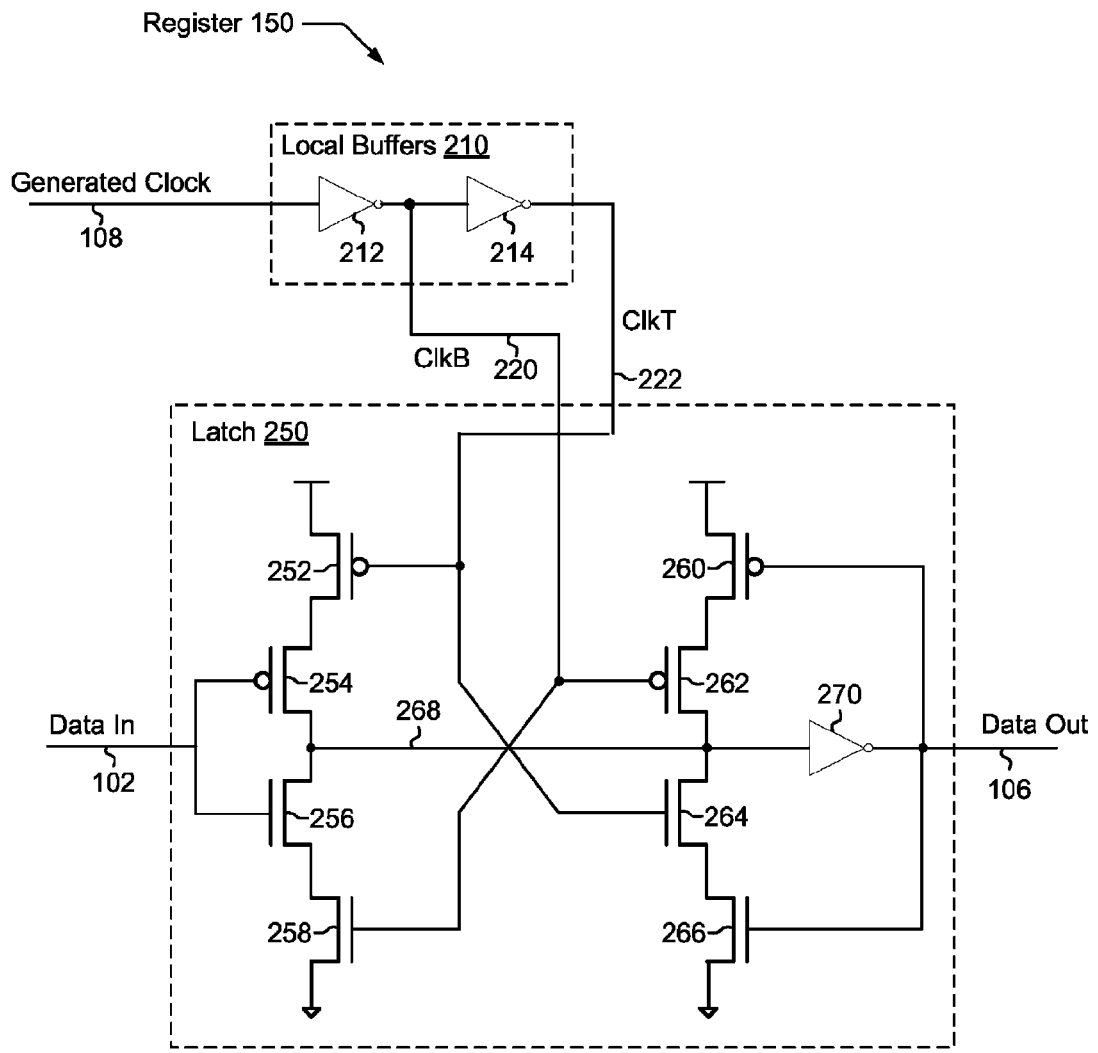
FIG. 2 is a generalized block diagram illustrating one embodiment of a register.

Turning now to FIG. 2, a generalized block diagram illustrating one embodiment of the register 150 is shown. Circuitry and logic shown here similar to circuitry and logic described above are similarly numbered. As shown in this embodiment, the local buffers 210 include two inverters 212 and 214 used to buffer the received clock signal on the Generated Clock line 108. The inverter 212 receives the clock signal on the line 108. The inverter 214 receives the output of the inverter 212. Each output of the inverters 212 and 214 is sent to the latch 250. The output of the inverter 212 is sent as ClkB on line 220. The output of the inverter 214 is sent as ClkT on the line 222.

In the embodiment shown, the register 150 is a latch. As described earlier, other embodiments may implement the register 150 as a flip-flop circuit, a RAM cell, and so forth. As shown, the latch 250 includes transistors 254 and 256 connected on the Data In line 102. The transistor 254 is in series with the transistor 252, which has its gate connected to ClkT on line 222. The transistor 256 is in series with the transistor 258, which has its gate connected to ClkB on line 220. Therefore, when the clock signal on the Generated Clock line 108 has a logic low value, the ClkT signal on line 222 also has a logic low value. The ClkB signal on line 220 has a logic high value. During this time, the transistors 252 and 258 are on and an inverted value of a data value on line 102 may be transmitted to the node 268. The logic value on node 268 is inverted and transferred to the Data Out line 106 through inverter 270. When the clock signal on the Generated Clock line 108 has a logic high value, the reverse scenario occurs and the transistors 252 and 258 turn off preventing data transmission from line 102 to node 268.

The transistors 262 and 264 are connected to the node 268. The transistor 262 is in series with the transistor 260, which has its gate connected to the output of the inverter 270 on the Data Out line 106. The transistor 262 has its gate terminal connected to ClkB on line 220. The transistor 264 is in series with the transistor 266, which has its gate connected to the output of the inverter 270 on the Data Out line 106. The transistor 2624 has its gate terminal connected to ClkT on line 222. Therefore, when the clock signal on the Generated Clock line 108 has a logic high value, the ClkT signal on line 222 also has a logic high value. The ClkB signal on line 220 has a logic low value. During this time, the transistors 262 and 264 are on and an inverted value of the data value stored on line 106 may be transmitted to the node 268. Thereby, the logic state of the latch 250 is maintained. When the clock signal on the Generated Clock line 108 has a logic low value, the reverse scenario occurs and the transistors 262 and 264 turn off preventing data transmission from line 106 to node 268.

Figure 3:
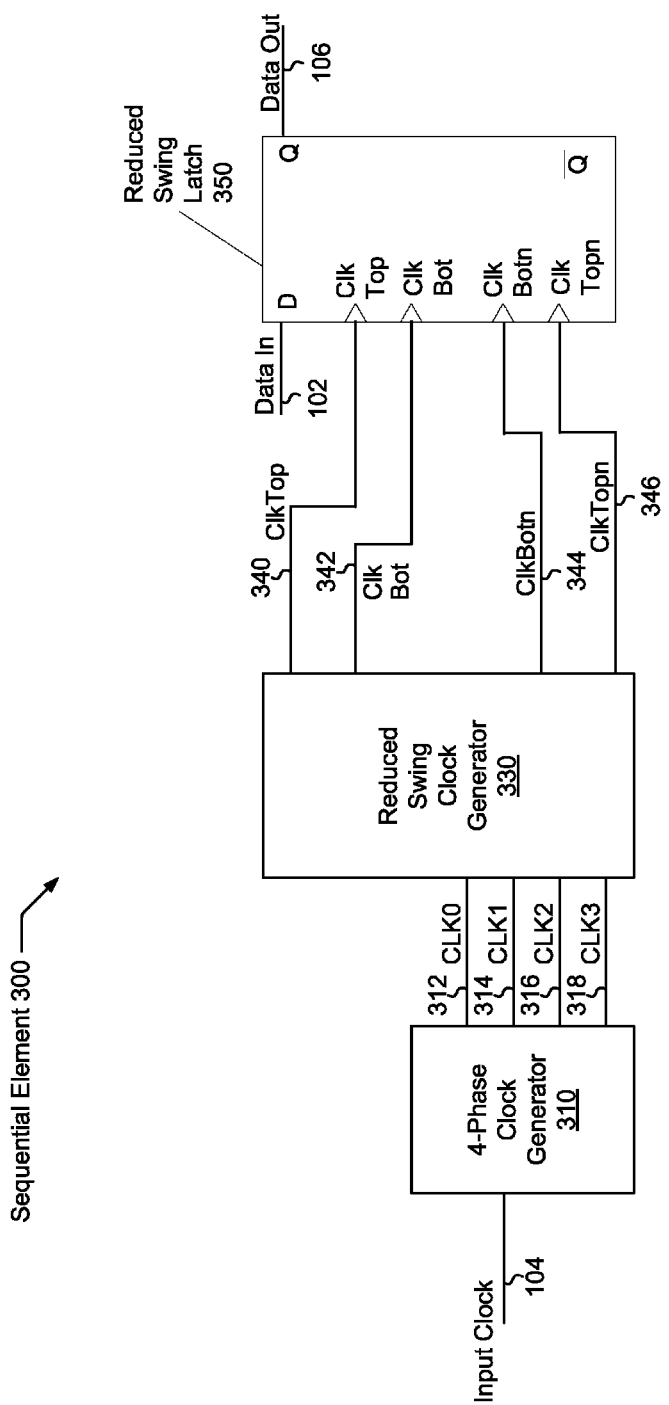
FIG. 3 is a generalized block diagram illustrating another embodiment of a sequential element.

Referring now to FIG. 3, a generalized block diagram illustrating another embodiment of a sequential element 300 is shown. Circuitry and logic shown here similar to circuitry and logic described above are similarly numbered. Similar to sequential element 100, the sequential element 300 may be used in at least a processor, an ASIC, an SOC, a GPU, a synchronous memory and so forth. Each type of semiconductor chip as listed may include a clock distribution network and circuitry. Generally speaking, the circuitry may include an interface for receiving one or more input clock signals from the clock distribution network, a clock generator for generating one or more additional clock signals based upon the received one or more input clocks, and a reduced voltage swing clock generator. As shown in FIG. 3, the sequential element 300 includes a 4-phase clock generator 310 that generates 4 clock waveforms received by reduced swing clock generator 330. A reduced voltage swing latch 350 receives the four reduced voltage swing clock waveforms sent by the clock generator 330. In the illustration shown, a storage element is a latch storage element. In another embodiment, the latch 350 may be replaced with a flip-flop circuit, a six-transistor (6T) random access memory (RAM) cell, or other storage element.

The 4-phase clock generator 310 provides the 4 clock waveforms Clk0 on line 312, Clk1 on line 314, Clk2 on line 316 and Clk3 on line 318. Each of the clock signals on lines 312-318 may have a fraction of the duty cycle of the Input Clock on line 104, but a same frequency. For example, the Input Clock may have a 50% duty cycle. Each of the clocks signals on lines 312-318 may have a 25% duty cycle. In addition, each of the clock signals on lines 312-318 may be active, or have a high pulse, during a separate portion of the clock cycle.

Based on the clock signals on lines 312-318, the reduced swing clock generator 330 provides reduced voltage swing clock waveforms. The ClkTop signal on line 340 and the ClkTopn signal on line 346 may have a same frequency as the Input Clock on line 104 and alternate between a half of the supply voltage and a full supply voltage. The ClkTop and ClkTopn signals on lines 340 and 346 may be generated within a top portion of a full voltage swing. In one embodiment, the top portion includes the range between half of the supply voltage and a full supply voltage. Other fractions and endpoints of a full voltage swing that occupy a top portion of the full voltage swing may be chosen based on design tradeoffs. The signals on lines 340 and 346 may be 180 degrees out of phase with one another. Further details are provided shortly.

The ClkBot signal on line 342 and the ClkBotn signal on line 344 may have a same frequency as the Input Clock on line 104 and alternate between a ground reference and a half of the supply voltage. The signals on lines 342 and 344 may be 180 degrees out of phase with one another. The ClkBot and ClkBotn signals on lines 342 and 344 may be generated within a bottom portion of a full voltage swing. In one embodiment, the bottom portion includes the range between the ground reference and half of the supply voltage. Other fractions and endpoints of a full voltage swing that occupy a bottom portion of the full voltage swing may be chosen based on design tradeoffs.

Although not shown, the reduced voltage swing latch 350 may include double output lines, feedback circuitry for the input, and scan circuitry. The reduced swing clock generator 330 may receive other control signals to affect the signals on lines 340-346. For example, the reduced swing clock generator 330 may receive a clock enable signal. The reduced voltage swing latch 350 may receive the clock signals on lines 340-346. The latch 350 may maintain a state dependent on these clock signals and the data signal received on the Data In line 102. Selected nodes within the latch 350 may have a reduced voltage clock swing whereby certain nodes transition between a ground reference and half of the supply voltage and certain nodes may transition between half of the supply voltage and the full supply voltage. Selected other nodes may have a traditional full voltage clock swing. Examples of nodes that utilize a reduced voltage swing include at least the inputs that receive the clock signals on lines 340-346.

In one embodiment, clock signals on lines 340-346 with a reduced voltage swing are received on gate terminals of transistors which may have a relatively high threshold. For example, an n-type field effect transistor (nfet) may receive on its gate terminal the ClkTop signal on line 340 or the ClkTopn signal on line 346. This nfet may have a threshold voltage value within the top portion of the full voltage swing. This nfet may have a threshold voltage between half of the voltage supply and the full voltage supply. Similarly, a p-type field effect transistor (pfet) may receive on its gate terminal the ClkBot signal on line 342 or the ClkBotn signal on line 344. This pfet may have a relatively high threshold voltage. As noted, although some nodes within the latch 350 there utilize a reduced voltage swing, other nodes within the latch 350 may utilize a full voltage swing. Examples of nodes that utilize a full voltage swing include at least the input that receives the data input signal 102 and the output that provides the data output signal 106. Additionally, one or more other internal nodes within the latch 350 may utilize a full voltage swing.

The power consumption of modern complementary metal oxide semiconductor (CMOS) chips is proportional to the expression $\alpha f C V^2$, where the symbol $\alpha$ is the switching factor, or the probability a node will charge up or discharge during a clock cycle; f is the operational frequency of the chip; C is the equivalent load capacitance to be charged or discharged in a clock cycle; and the symbol V is the operational voltage of the chip. In order to reduce power consumption, one or more of these parameters may be reduced. By using half of the voltage swing within the reduced swing clock generator 330 and within the latch 350, the term $V^2$ reduces the power consumption on given nodes to one quarter of the original power.

Figure 4:
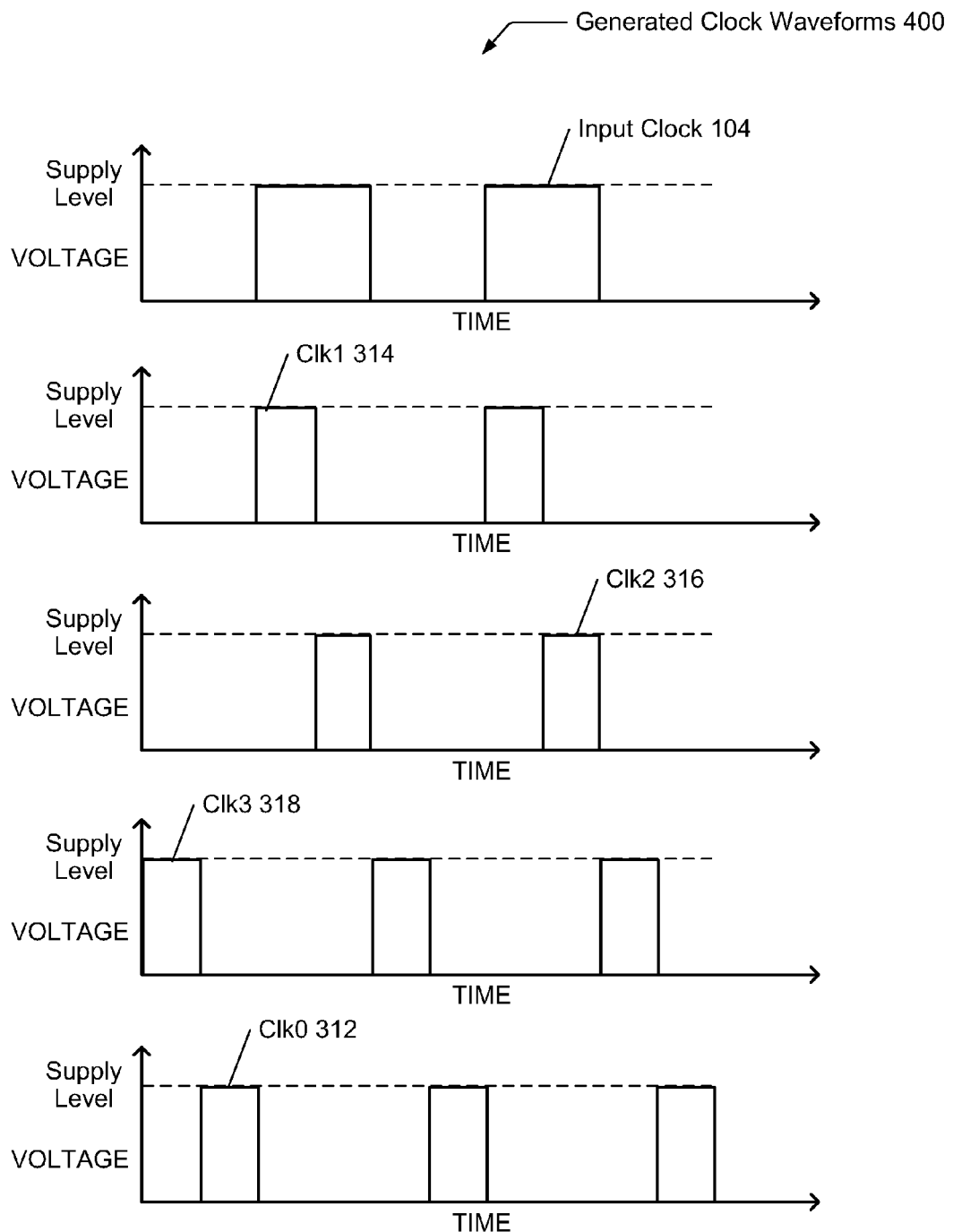
FIG. 4 is a generalized block diagram illustrating one embodiment of generated clock waveforms from a 4-phase clock generator.

Turning now to FIG. 4, a generalized block diagram illustrating one embodiment of generated clock waveforms 400 from the 4-phase clock generator is shown. As described above, the 4-phase clock generator 310 may use the Input Clock on line 104 as a timing reference to create the clock waveforms Clk0 on line 312, Clk1 on line 314, Clk 2 on line 316 and Clk3 on line 318. Each of the clock signals on lines 312-318 may have a fraction of the duty cycle of the Input Clock on line 104, but a same frequency.

One embodiment of the timing relationships between the Input Clock on line 104 and the clock signals on lines 312-318 is shown in the waveforms 400. The rising edge of Clk1 on line 314 is approximately coincident with the rising edge of the Input Clock on line 104. The Clk2 on line 316 may have a phase delay of one-quarter clock cycle from the Clk1. The Clk3 on line 318 may lag the Clk2 by one quarter of a clock cycle. The Clk0 on line 312 may lag Clk3 by one-quarter of a clock cycle. Therefore, in one embodiment, each of the clock signals on lines 312-318 is phase shifted 90 degrees from a phase reference of a previous one of the clock signals on lines 312-318.

Figure 5:
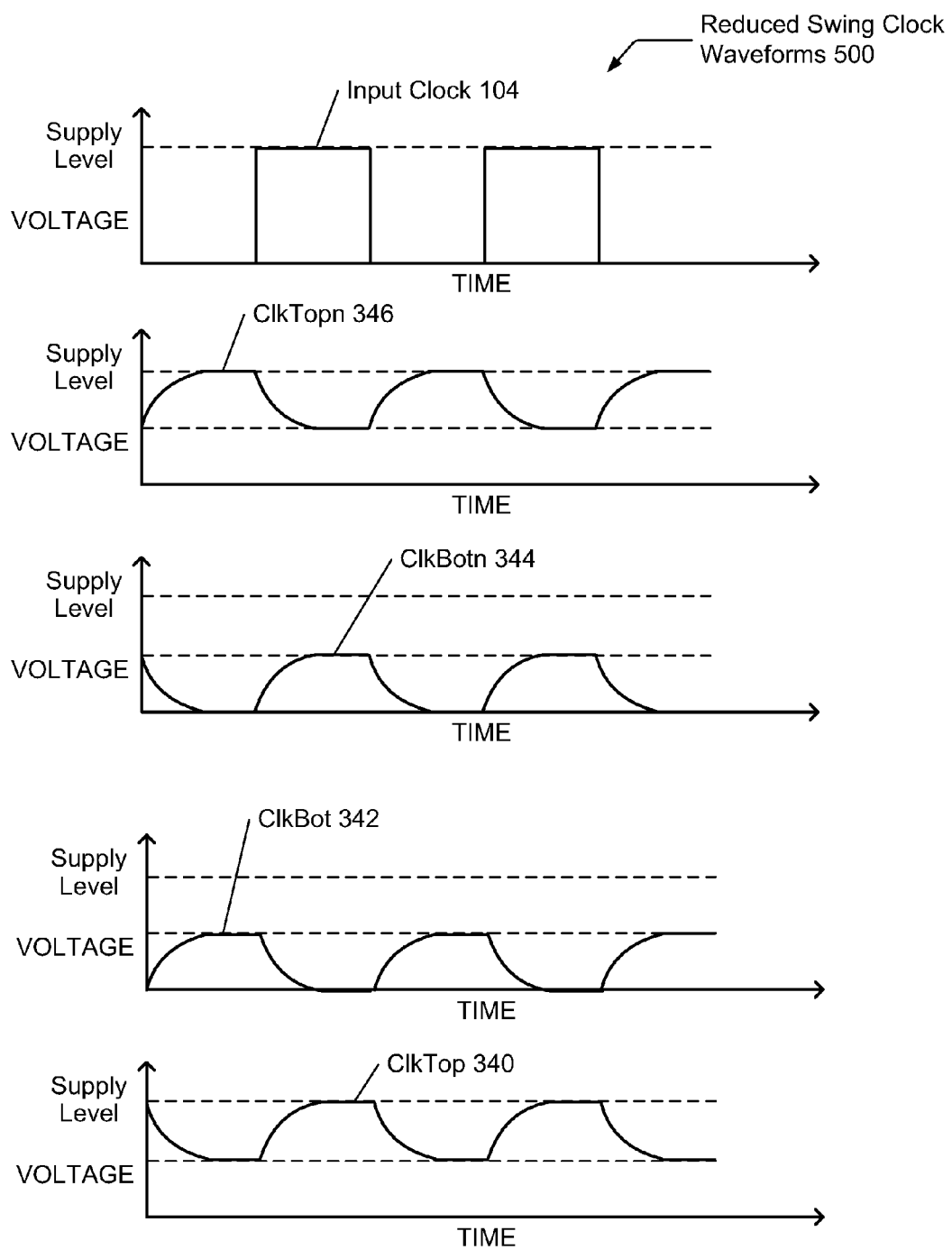
FIG. 5 is a generalized block diagram illustrating one embodiment of generated reduced voltage swing clock waveforms from reduced voltage swing clock generators.

Turning now to FIG. 5, a generalized block diagram illustrating one embodiment of generated reduced voltage swing clock waveforms 500 from the reduced voltage swing clock generator is shown. As described above, the reduced voltage swing clock generator 330 may use the clock signals on lines 312-318 as timing references to create the reduced voltage swing clock signals ClkTop on line 340, ClkBot on line 342, ClkBotn on line 344, and ClkTopn on line 346.

Each of the clock signals on lines 340-346 may have a same duty cycle of the Input Clock on line 104 and a same frequency. The clock signals ClkTop and ClkBotn on lines 340 and 344 may have a rising edge approximately coincident with the rising edge of the Input Clock on line 104. The clock signals ClkBot and ClkTopn on lines 342 and 346 may have a rising edge approximately coincident with the falling edge of the Input Clock on line 104. Therefore, a first half of the clock signals on lines 340-346 are 180 degrees out of phase with a second half of the clock signals on lines 340-346.

A magnitude of the voltage range of each of the clock signals on lines 340-346 may be a fraction of the power supply voltage, or the operational voltage. Each of the clock signals ClkTop and ClkTopn on lines 340 and 346 may have a voltage range between a given voltage level and an intermediate value between the power supply voltage and the ground reference. In one embodiment, the given voltage level may be the power supply voltage. Alternatively, the given voltage level may be a voltage value near the power supply voltage. The given voltage level may not actually reach the power supply voltage.

Continuing with the voltage range, in one example, the given voltage level may be designed to be a majority fraction of the power supply voltage. In one such example, the given voltage level may be 90% of the power supply voltage. Other fractional values are possible and contemplated. In one embodiment, a selection for a value of the given voltage level may be based on a threshold voltage for a high threshold transistor, an acceptable level of performance for a transistor operating with the given voltage level on its gate terminal rather than the power supply voltage and so forth.

Each of the clock signals ClkBot and ClkBotn on lines 342 and 344 may have a voltage range between the intermediate value and another given voltage level. In one embodiment, the other given voltage level may be a ground reference. Alternatively, the other given voltage level may be a voltage value near the ground reference. Similar to the above discussion for the given voltage level being at or near the power supply voltage, a selection for the value of this other given voltage level may be based on several criteria including operation of a transistor receiving the given voltage level.

In one embodiment, a magnitude of the voltage range of each of the clock signals on lines 340-346 may be one-half of the power supply voltage, or operational voltage. Therefore, in this embodiment, the intermediate value is half of the power supply voltage. In other embodiments, the intermediate value may be a different fraction of the power supply voltage. As described above, the amount of power consumed to charge a capacitance on the chip is proportional to the square of the operational voltage. Therefore, when the intermediate value is half of the power supply voltage, an amount of power consumed to generate the clock signals on lines 340-346 may be approximately one-fourth of the power consumed to generate clock signals with a full voltage swing.

Figure 6:
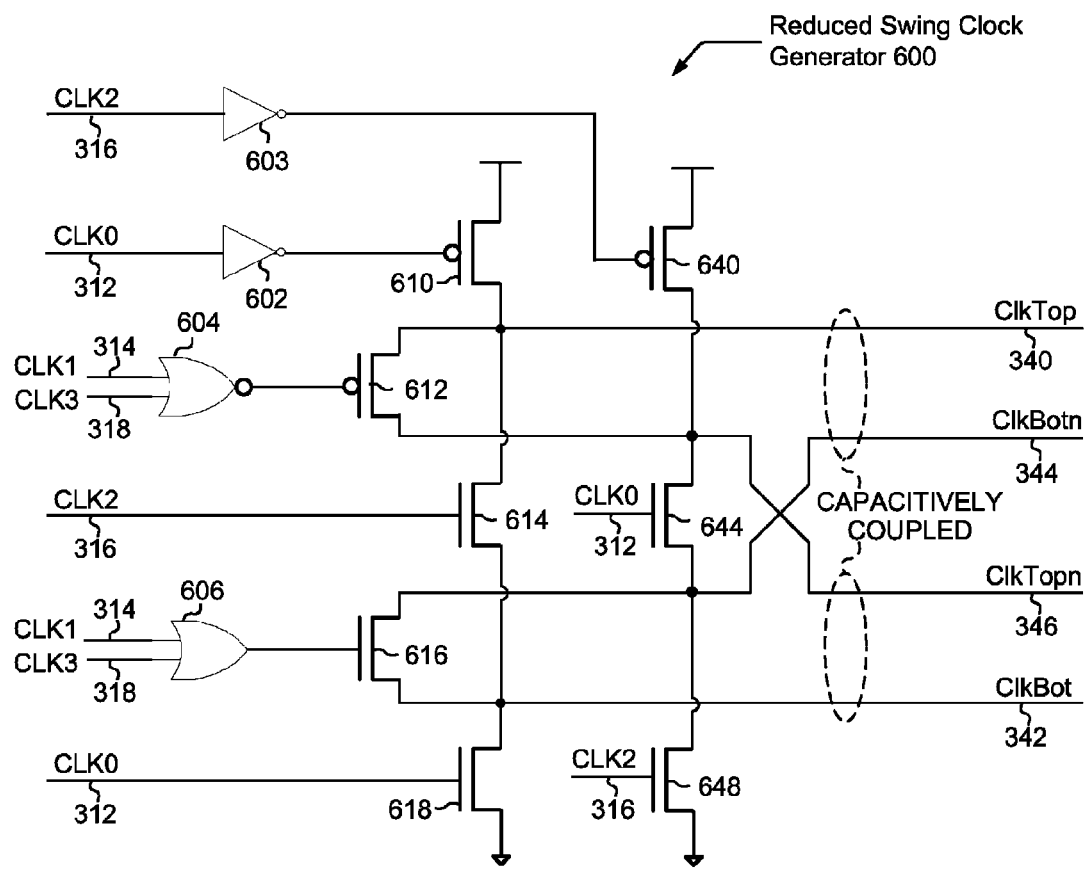
FIG. 6 is a generalized block diagram illustrating one embodiment of a reduced voltage swing clock generator.

The circuit description provided by FIG. 6 illustrates an embodiment for a reduced swing clock generator that provides at least four reduced swing clock signals. Two of the four generated clock signals in this example are complements of the other two generated clock signals. For example, the reduced swing clock signals ClkTop and ClkBot on lines 340 and 342 are generated. In addition, their complement clock signals ClkTopn and ClkBotn on lines 346 and 344 are generated. Other examples of circuit designs used to generate complements of generated reduced swing clock signals are possible and contemplated. Further details of the circuit design for generating reduced swing clock signals and their complements are provided below.

Referring now to FIG. 6, a generalized block diagram of one embodiment of a reduced voltage swing clock generator 600 is shown. The clock signals Clk0 on line 312, Clk1 on line 314, Clk 2 on line 316 and Clk3 on line 318 are received by the clock generator 600 and used to produce the reduced voltage swing clock signals ClkTop on line 340 and ClkBot on line 342 and additionally their complement signals ClkTopn and ClkBotn on lines 346 and 344. The load capacitance on each of the clock lines 340 and 342 may include the wire capacitance, the drain capacitances of transistors used to generate the clock signals and the gate capacitances of transistors within sequential elements used to receive the clock signals.

In one embodiment, each of the clock lines 340 and 342 may be routed and connected to have a ratio of load capacitances equal to a ratio of the intermediate value to a difference between the intermediate value and the power supply voltage. The ratio of the load capacitances may be used to provide an intermediate value on each of the clock lines 340 and 342 when these clock lines are shorted together. In one embodiment, the load capacitance of each of the lines 340 and 342 may be made the same. Therefore, when the clock lines are shorted together, the intermediate value may be half of the power supply voltage due to conservation of charge on the lines 340 and 342. In addition, the signal ClkBotn on line 344 may be capacitatively coupled to ClkTop on line 340. The wire routing for ClkBotn on line 344 may follow the wire routing of ClkTop on line 340 with a minimal spacing between the routes. The signal ClkTopn on line 346 may be similarly capacitatively coupled to signal ClkBot on line 342.

Initially, ClkTop on line 340 and ClkBotn on line 344 may have a logic high value. A logic high value for ClkTop on line 340 may be the power supply voltage. A logic high value for ClkBotn on line 344 may be an intermediate voltage level, such as half of the power supply voltage. The signal ClkBot on line 342 and ClkTopn on line 346 may have a logic low value. A logic low value for ClkBot on line 342 may be the ground reference. A logic low value for ClkTopn on line 346 may be the intermediate voltage level, such as half of the power supply voltage. Referring again to FIG. 4, the rising edge of Input Clock on line 104 may trigger Clk1 on line 314 to rise to a logic high value. In the reduced voltage swing clock generator 600, the signal Clk1 is received by both a binary NOR gate 604 and a binary OR gate 606. The transistor 612 receives the output of the NOR gate 604. The transistor 616 receives the output of the OR gate 606. The rise of Clk1 causes both transistors 612 and 616 to turn on.

As transistor 612 turns on, ClkTop on line 340 is shorted to ClkTopn on line 346. At this time, electrical charge is shared between ClkTop on line 340 and ClkTopn on line 346. Initially, ClkTop may have a higher voltage level than ClkTopn. For example, ClkTop may have an initial value of the power supply voltage and ClkTopn may have an initial value of the intermediate voltage, such as half of the supply voltage. Therefore, the voltage for ClkTop on line 340 may drop and the voltage on ClkTopn on line 346 may rise.

Approximately one-quarter of a clock cycle later, the signal Clk1 on line 314 falls to a logic low value, which turns off transistors 612 and 616. At approximately the same time, the signal Clk2 on line 316 rises to a logic high value. The gate terminal of transistor 614 receives the signal Clk2 on line 316. In addition, the transistor 648 receives on its gate terminal the signal Clk2 on line 316. The transistor 640 receives on its gate terminal an inverted value of Clk2. The inverter 603 may invert the signal Clk2 for the transistor 640. As transistor 614 turns on, ClkTop on line 340 is shorted to ClkBot on line 342. In addition, as transistor 640 turns on, ClkTopn on line 346 is shorted to the power supply voltage.

As transistor 648 turns on, ClkBotn on line 344 is shorted to the ground reference. Each of the clock lines 340 and 342 may not be connected to either the power supply voltage or the ground reference. At this time, electrical charge is shared between ClkTop on line 340 and ClkBot on line 342. In one embodiment, the total load capacitance on each of the lines 340 and 342 may be the same. Accordingly, the signals ClkTop and ClkBot may reach a voltage level of approximately one-half of the power supply. In other embodiments, the ratio of the load capacitances on lines 340 and 342 may have different values that create an intermediate voltage value that is different than one half of the power supply voltage.

At the falling edge of Input Clock on line 104, the signal Clk2 on line 316 may fall to a logic low value and signal Clk3 on line 318 may rise to a logic high value. Similar to the signal Clk1 on line 314, the signal Clk3 on line 318 is received by both the binary NOR gate 604 and the binary OR gate 606. Therefore, transistors 614, 640 and 648 may turn off and transistors 612 and 616 may turn on.

When the transistor 612 turns on, ClkTop on line 340 is once again shorted to ClkTopn on line 346. At this time, electrical charge is shared between ClkTop on line 340 and ClkTopn on line 346. The signal ClkTop may have half of the supply voltage on line 340 due to being previously shorted with ClkBot on line 342. The signal ClkTopn may have a logic high value due to being previously shorted to the power supply voltage. Therefore, the voltage for ClkTop on line 340 may rise and the voltage on ClkTopn on line 346 may drop.

When transistor 616 turns on, ClkBotn on line 344 is shorted to ClkBot on line 342. At this time, electrical charge is shared between ClkBotn on line 344 and ClkBot on line 342. The signal ClkBotn may have a logic low value due to being previously shorted with the ground reference. The signal ClkBot may have half of the supply voltage on line 342 due to being previously shorted with ClkTop on line 340. Therefore, the voltage for ClkBotn on line 344 may rise and the voltage on ClkBot on line 342 may drop.

The inverter 602 and the transistors 618 and 644 may receive the signal Clk0 on line 312. The transistor 610 may receive the output of the inverter 602 on its gate terminal. At the end of the clock cycle, the signal Clk0 on line 312 may rise. As a result, the transistors 610, 618 and 644 turn on.

As transistor 610 turns on, ClkTop on line 340 is charged up due to being shorted to the power supply. ClkTop on line 340 may already have a value close to the power supply voltage due to acquiring charge from ClkTopn on line 346 when Clk3 on line 318 had a logic high value. Accordingly, an amount of energy sourced from the power supply to completely charge ClkTop on line 340 may be reduced. Thereby, an amount of power consumed by the clock distribution system may also be reduced.

The transistor 614 is turned off, so ClkBot on line 342 is not shorted to the power supply. As transistor 618 turns on, ClkBot on line 342 is shorted to the ground reference and its value falls to a logic low value. The power savings within the clock generator 600 may be additionally due to the charge from ClkTop on line 340 is temporarily stored in ClkTopn on line 346 when ClkTop on line 340 is discharged. This stored charge is used later in the clock cycle to assist in re-charging ClkTop on line 340. Therefore, less energy is utilized by the power supply to re-charge ClkTop on line 340. A similar mechanism is utilized for the signals on lines 342, 344 and 346.

As transistor 644 turns on, ClkBotn on line 344 is shorted to ClkTopn on line 346. Each of the clock lines 344 and 346 may not be connected to either the power supply voltage or the ground reference. At this time, electrical charge is shared between ClkBotn and ClkTopn on lines 344 and 346. In one embodiment, the total load capacitance on each of the lines 34 and 346 may be the same. Accordingly, the signals ClkBotn and ClkTopn may reach a voltage level of approximately one-half of the power supply. In other embodiments, the ratio of the load capacitances on lines 344 and 346 may have different values that create an intermediate voltage value that is different than one half of the power supply voltage. As described above, each of the reduced swing clock signals ClkBotn on line 344 and ClkTopn on line 346 may be used as ballast lines to generate complements of the ClkTop and ClkBot signals on lines 340 and 342 and vice-versa.

Figure 7:
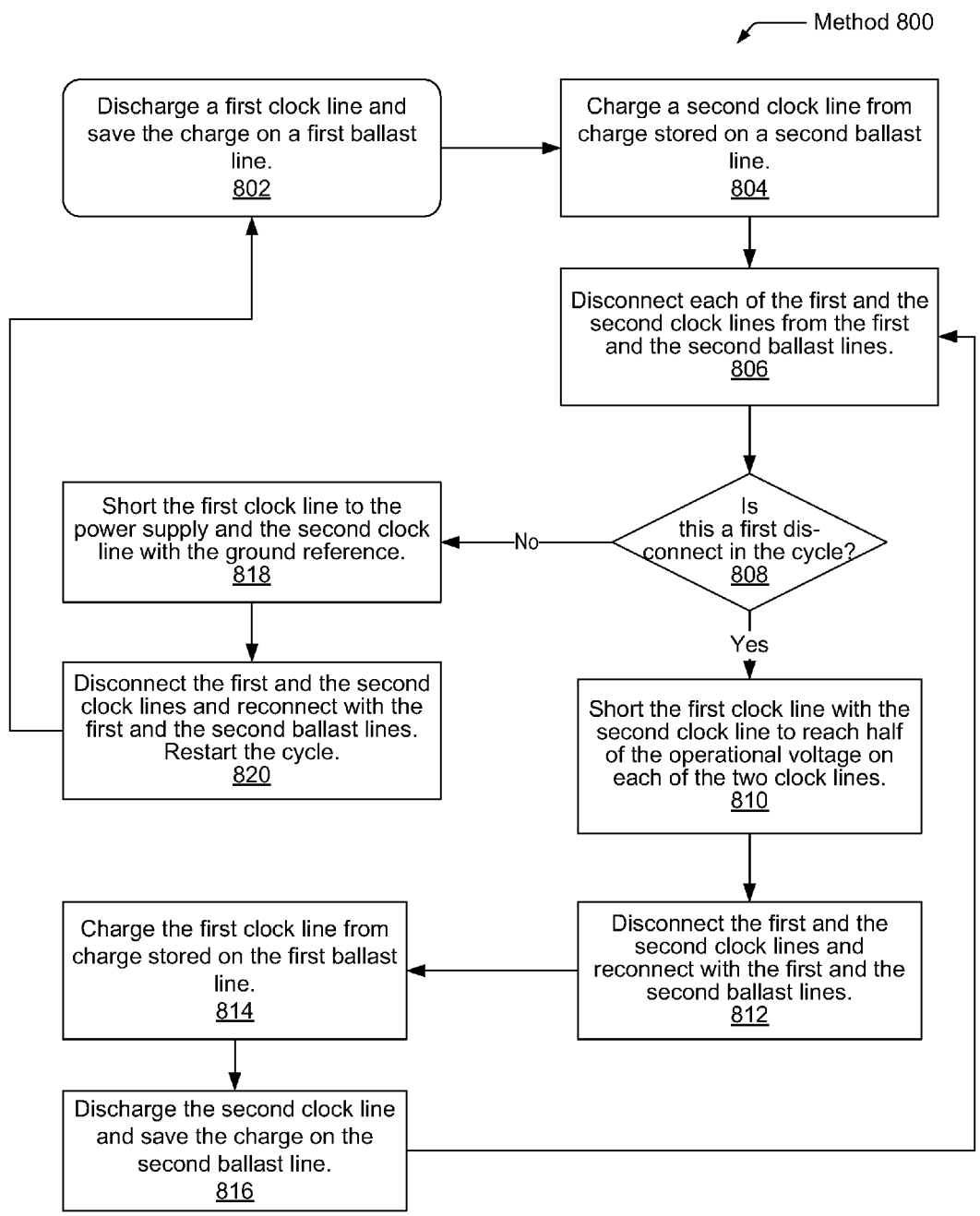
FIG. 7 is a generalized flow diagram illustrating one embodiment of a method for providing reduced voltage swing clock signals.

Turning now to FIG. 7, a generalized flow diagram illustrating one embodiment of a method 800 for providing reduced voltage swing clock signals is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 802, a first clock line initially has a logic high value and it is discharged. A first ballast line saves the charge removed from the first clock line. In block 804, a second clock line initially has a logic low value and it is charged from charge stored on a second ballast line. In one embodiment, the first clock line is capacitively coupled to the second ballast line and the second clock line is capacitively coupled to the first ballast line. Further, each of the first and the second clock lines may be made to have a same load capacitance including wire and gate capacitance. In block 806, each of the first and the second clock lines may be disconnected from the first and the second ballast lines. In one embodiment, the transitions to connect and disconnect the first and the second clock lines are dependent on a sequencing of received non-overlapping clock signals. Each of the non-overlapping clock signals may have a duty cycle smaller than half of the clock cycle.

If this is a first disconnect with the ballast lines in the cycle (conditional block 808), then in block 810, the first clock line may be shorted with the second clock line. Charge is shared on both clock lines and each of the clock lines may reach a value equal to half of the operational voltage. Therefore, the first clock line was discharging from a logic high value, but stopped at half of the operational voltage, rather than falling to the ground reference. Similarly, the second clock line was rising from a logic low value, but stopped at half of the operational voltage, rather than rising to the power supply value. Each of the clock lines experienced a reduced voltage swing, rather than a full voltage swing. In one embodiment, the connections and disconnections of the clock lines with other lines such as each other and the ballast lines is done with transistors being turned on and off in a given sequence.

In block 812, the first and the second clock lines may be disconnected from one another and reconnected with the first and the second ballast lines. In block 814, the first clock line may be charged from charge stored on the first ballast line. In block 816, the second clock line may be discharged and the removed charge may be saved on the second ballast line. Each of the first and the second clock lines are returning to their original values, but each is not consuming energy for a full voltage swing. Control flow of method 800 may return to block 806. Each of the first and the second clock lines may be disconnected from the first and the second ballast lines.

If this is not a first disconnect with the ballast lines in the cycle (conditional block 808), then in block 818, the first clock line may be shorted to the power supply and the second clock line may be shorted with the ground reference. Each of the clock lines may reach full initial values equivalent to the power supply value and the ground reference, respectively. In block 820, the first and the second clock lines may be disconnected from one another and reconnected with the first and the second ballast lines. Control flow of method 800 returns to block 802 and the process repeats. The sequence of connections and charging and discharging of the lines may provide two clock waveforms with a reduced voltage swing. In some embodiments, the first and the second ballast lines may be used as complements to the two reduced voltage swing clock signals. For example, a circuit as shown in FIG. 6 and described above may be used. In some embodiments, an intermediate voltage level other than half of the power supply voltage may be used.

Figure 8:
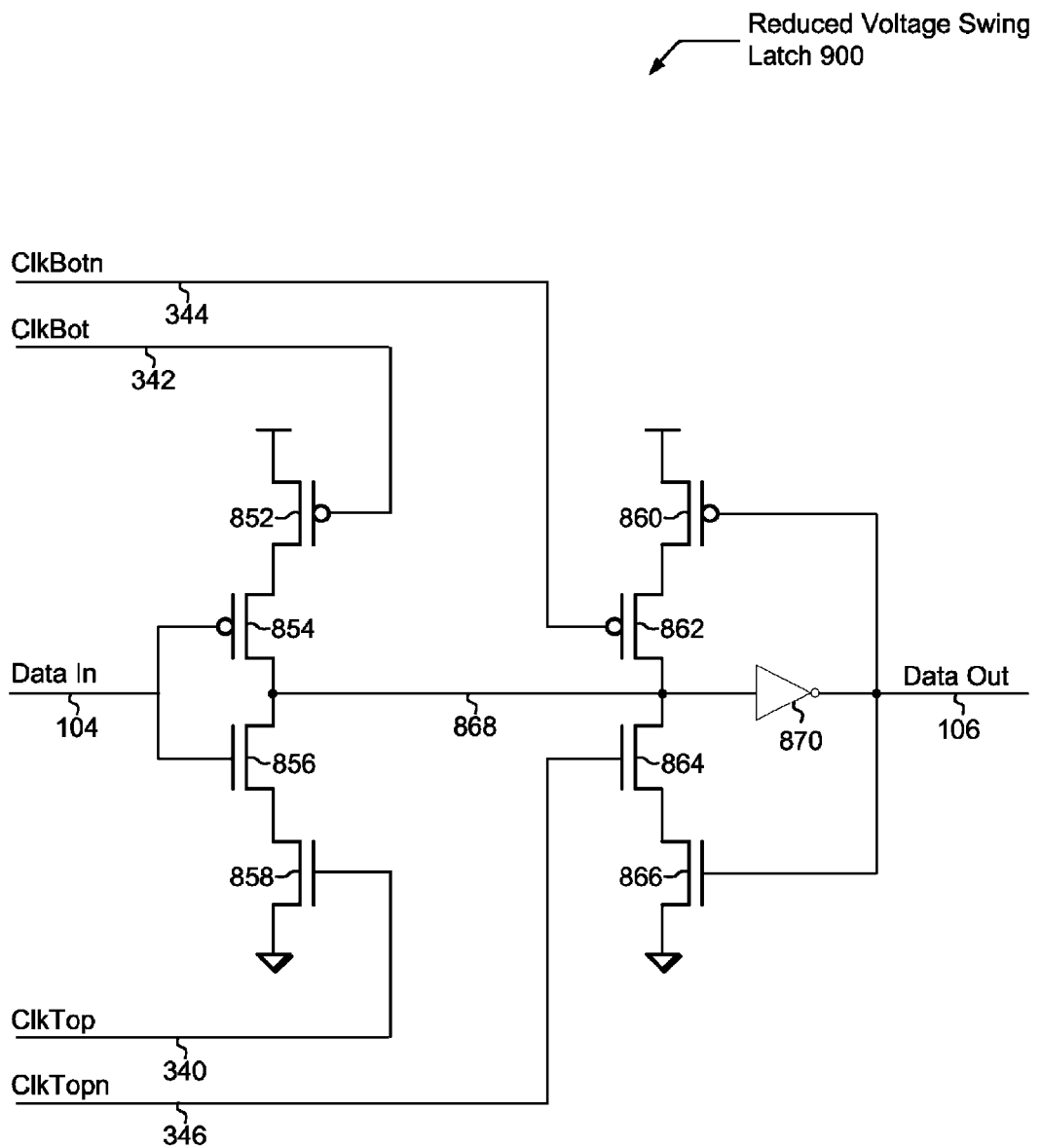
FIG. 8 is a generalized block diagram illustrating one embodiment of a reduced voltage swing latch.

Referring now to FIG. 8, a generalized block diagram illustrating one embodiment of a reduced voltage swing latch 900 is shown. Circuitry and logic shown here similar to circuitry and logic described above are similarly numbered. Although a latch is shown, the principles applied to latch 900 may be applied to a flip-flop or other storage elements. The transistors 852-866 may use a same topology as transistors 252-266 in latch 250. However, transistors 852, 858, 862 and 864, which are connected to reduced swing clock signals, may have relatively high threshold values. For example, the nfet transistors 858 and 864 that receive on their gate terminals the ClkTop and ClkTopn signals on lines 340 and 346, respectively, may have a threshold voltage value within the top portion of the full voltage swing. The threshold voltage value may be between half of the voltage supply and the full voltage supply. Similarly, the pfet transistors 852 and 862 may have a relatively high threshold magnitude.

The latch 900 receives the reduced voltage swing clock signals ClkTop on line 340, ClkBot on line 342, ClkBotn on line 344 and ClkTopn on line 346. The latch 900 uses these reduced voltage swing clock signals to maintain a state on Data Out line 106 dependent on a value on the Data In line 102. As described earlier regarding the clock waveforms in FIG. 5, the reduced voltage swing clock signals on lines 340-346 may transition from a given voltage level to an intermediate voltage level. Depending on a particular clock signal of the clock signals on lines 340-346, the given voltage level may be at or near the power supply voltage. Alternatively, depending on the particular clock signal, the given voltage level may be at or near the ground reference. The corresponding voltage range between the given voltage level and the intermediate voltage level may be may be a fraction of the power supply voltage, or the operational voltage.

Generally speaking, the latch 900 opens and transmits a data value on the Data In line 102, in response to receiving at least one of the reduced voltage swing clock signals on lines 340-346 at the given voltage level. For example, in response to the transistors 852 and 858 receive a corresponding given voltage level on their respective gate terminals, the latch 900 opens. The latch 900 closes and holds an output data value on the Data Out line 106, in response to receiving at least one of the reduced voltage swing clock signals on lines 340-346 at the intermediate voltage level. For example, when the transistors 852 and 858 receive an intermediate value on their respective gate terminals, the latch 900 closes. Further details are provided below.

The transistor 852 has its gate terminal connected to ClkBot on line 342. The transistor 858 has its gate terminal connected to ClkTop on line 340. Initially, ClkTop on line 340 may have a logic high value. The signal ClkBot on line 342 may have a logic low value. Therefore, transistors 852 and 858 turn on despite having high thresholds. During this time, an inverted value of a data value on line 102 may be transmitted to the node 868. The logic value on node 868 is inverted and transferred to the Data Out line 106 through inverter 870.

The transistors 862 and 864 may also have relatively high threshold voltage values. The transistor 862 has its gate terminal connected to ClkBotn on line 344. The transistor 864 has its gate terminal connected to ClkTopn on line 346. Initially, each of ClkBotn and ClkTopn may have a value equivalent to half of the operational voltage. Therefore, the transistors 862 and 864 may be turned off due to their relatively high threshold values.

During a next half of the clock cycle, the signals ClkTop and ClkBot on lines 340 and 342 may transition to a value equivalent to half of the operational voltage. Referring again to FIG. 5, these waveforms are shown. These waveforms may be produced by circuitry shown in FIG. 6. The transistors 852 and 858 within the latch 900 may turn off due to their high thresholds. Therefore, further changes on the Data In line 102 may not be propagated to node 868.

During this same half of the clock cycle, the signal ClkBotn on line 344 may transition to the ground reference. The signal ClkTopn on line 346 may transition to the power supply value. The transistors 862 and 864 may turn on despite their high thresholds. Now the logic value present on the Data Out line 106 may be inverted through transistors 860 and 866 onto node 868. Thereby, the logic state within the latch 900 is maintained. As shown, no local clock buffers are used, which reduces the power consumed by the latch 900 in addition to utilizing reduced voltage swing clock signals on lines 340-346.

Figure 9:
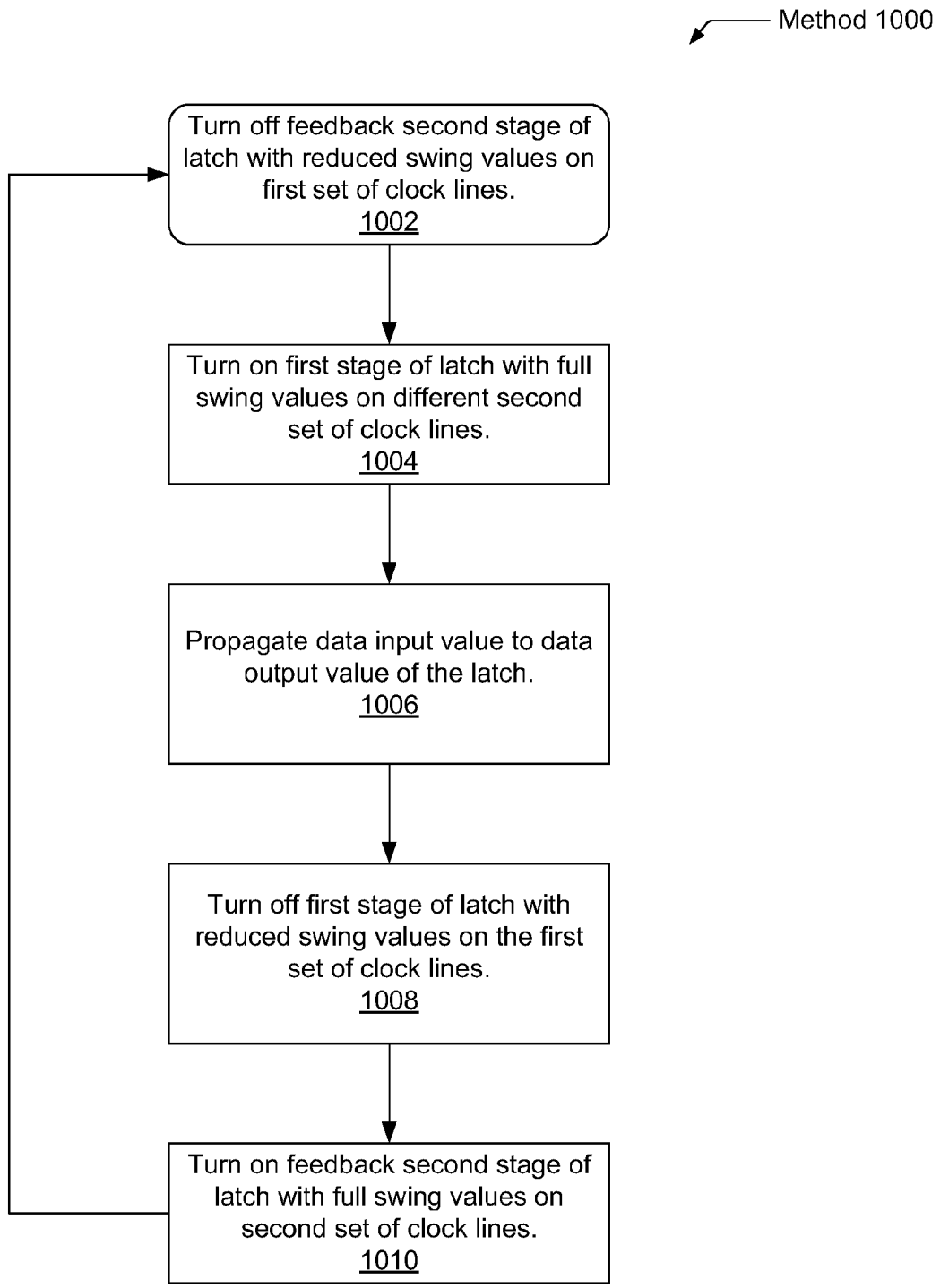
FIG. 9 is a generalized flow diagram illustrating one embodiment of a method for latching data values using reduced voltage swing clock signals.

Turning now to FIG. 9, a generalized flow diagram illustrating one embodiment of a method 1000 for latching data values using reduced voltage swing clock signals is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 1002, a feedback second stage of a latch may be turned off with reduced swing values on a first set of clock lines. Rather than utilize full swing values, such as a power supply value and a ground reference value used for logic high and low values, a fraction of the operational voltage may be used to turn off the second stage. In one embodiment, the reduced swing value is half of the full swing value of the voltage level. The second stage may be a slave configuration in a master-slave configured latch. The second stage may use high threshold transistors. Therefore, values on the gate terminals equivalent to half of the operational voltage may not turn on these transistors. The first set of clock signals may be provided by a reduced voltage swing clock generator.

In block 1004, the first stage of the latch may be turned on with full swing values on a second set of clock lines different from the first set of clock lines. At this time, these clock lines may use a power supply value and a ground reference value used for logic high and low values to turn on transistors within the first stage. The first stage may be a master configuration within a master-slave configured latch. In block 1006, any data value on the data input line is propagated through the latch to the data output line, since the first stage is turned on and it's transparent.

In block 1008, the first stage is turned off with reduced swing values on the first set of clock lines. The first stage may also use high threshold transistors. Therefore, values on the gate terminals equivalent to half of the operational voltage may not turn on these transistors. In block 101, the feedback second stage of the latch may be turned on with full swing values on the second set of clock lines. The feedback second stage may place an inverted value on an internal node of the value stored on the data output line. The internal node may be inverted and provided on the data output line. This feedback loop maintains the state of the latch. The first and the second stages utilize reduced voltage swings to pass though, load and maintain different states. The use of the reduced voltage swing values reduced power consumption of the latch.

Figure 10:
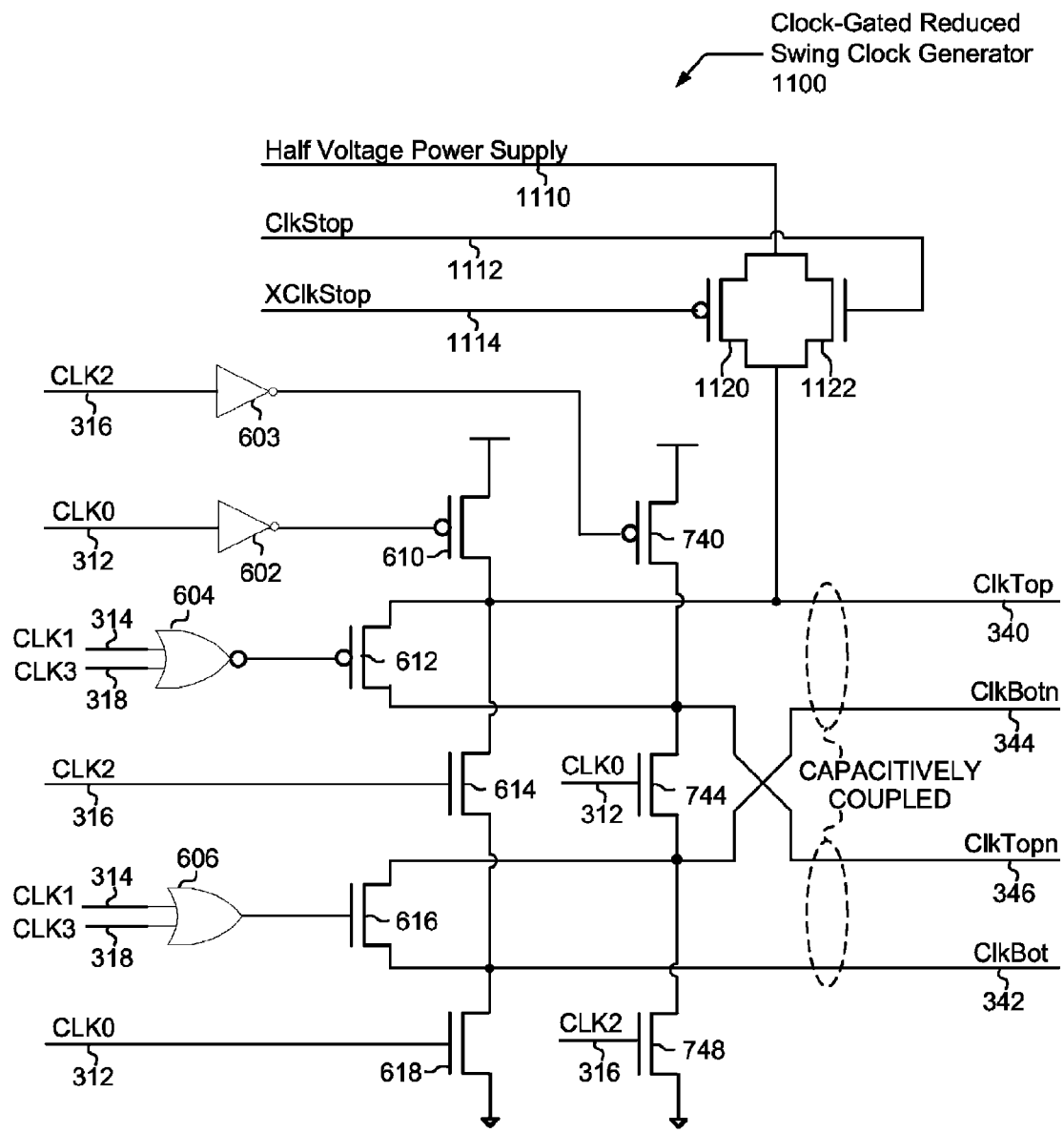
FIG. 10 is a generalized block diagram illustrating one embodiment of a clock-gated reduced voltage swing clock generator.

Referring now to FIG. 10, a generalized block diagram illustrating one embodiment of a clock-gated reduced voltage swing clock generator 1100 is shown. Circuitry and logic shown here similar to circuitry and logic described above are similarly numbered. Similar to the clock generators 600, 700 and 730, the generator 1100 receives non-overlapping clock signals on lines 312-318 to provide reduced voltage swing clock signals.

The clock generator 1100 allows clock gating to occur in order to adhere to given power modes that may turn off clock signals. Transistors 1120 and 1122 may be connected as a transmission gate. The control signal ClkStop 1112 may be received on the gate terminal of transistor 1122. The control signal XClkStop 1114 may be received on the gate terminal of transistor 1120. During an active mode of operation, the control signal ClkStop 1112 may have a logic low value. In addition, the control signal XClkStop 1114 may have a logic high value. Therefore, the transistors 1120 and 1122 may be turned off and the transmission gate formed by transistors 1120 and 1122 may be in a high impedance state.

In one embodiment, the Input Clock on line 104 may be stopped when it has a logic high value. As a result, Clk2 on line 316 may have a logic high value. The signal Clk2 on line 316 may maintain a logic high value until a falling edge occurs on the Input Clock on line 104. While Clk2 on line 316 has a logic high value, transistor 614 is turned on. As a result, ClkTop on line 340 is shorted to ClkBot on line 342. At this time, electrical charge is shared between ClkTop on line 340 and ClkBot on line 342. The total load capacitance on each of the lines 340 and 342 may be the same. Accordingly, the signals ClkTop and ClkBot may reach a voltage level of approximately one-half of the power supply.

The control signal ClkStop 1112 may rise to a logic high value and turn on the transistor 1122. The control signal XClkStop 1114 may fall to a logic low value and turn on transistor 1120. The transmission gate formed by transistors 1120 and 1122 may be on and short ClkTop on line 340 with line 1110, which is held at a value equivalent to half of the power supply, or operational voltage. The signal ClkBot on line 342 is shorted to ClkTop on line 340 through transistor 614. Therefore, both ClkTop and ClkBot are held at a value equal to half of the operational voltage while the Input Clock 104 is stopped. In addition, with ClkTop and ClkBot being held at half of the operational voltage, the reduced voltage swing latch 900 maintains its logical state while the Input Clock on line 104 is stopped.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A reduced voltage swing clock distribution network comprising:
   a clock generator configured to provide a first plurality of clock signals, wherein the first plurality of clock signals are non-overlapping clock signals; and
   a reduced voltage swing clock generator, wherein the reduced voltage swing clock generator is configured to:
      transition a clock signal of at least one of a second plurality of clock signals from a first voltage level to an intermediate voltage level that is between a power supply voltage and a ground reference, in response to detecting a rising edge of a first one of the first plurality of clock signals;
      prevent said clock signal from reaching one of the power supply voltage or the ground reference by holding said clock signal at the intermediate voltage level for at least a pulse width of a second one of the first plurality of clock signals; and
      transition said clock signal back to the first voltage level in response to detecting a rising edge of a third one of the first plurality of clock signals.

2. The distribution network as recited in claim 1 further comprising a latch coupled to receive the second plurality of clock signals, wherein the latch is configured to:
   hold an output data value, in response to receiving at least one of the second plurality of clock signals at the intermediate voltage level; and
   transmit a data input value, in response to receiving at least one of the second plurality of clock signals at the first voltage level.

3. The distribution network as recited in claim 1, wherein a given pair of the second plurality of clock signals are on a pair of clock lines with a ratio of loading capacitance that is equal to a ratio of the intermediate voltage level to a difference between the intermediate voltage level and the power supply voltage.

4. The distribution network as recited in claim 3, wherein the given pair of clock lines are shorted together during the pulse width of the second one of the first plurality of clock signals.

5. The distribution network as recited in claim 4, wherein the given pair of clock lines is not connected to the power supply voltage or the ground reference during the pulse width of the second one of the first plurality of clock signals.

6. The distribution network as recited in claim 4, wherein the reduced voltage swing clock generator is further configured to store a portion of an electrical charge on each of the given pair of clock lines on a respective ballast line for reuse later in a clock cycle.

7. The distribution network as recited in claim 4, wherein the reduced voltage swing clock generator is further configured to hold each of the second plurality of clock signals at the intermediate voltage level when an input clock is stopped at a logic high value.

8. The distribution network as recited in claim 5, wherein the reduced voltage swing clock generator is further configured to provide a voltage range for at least one of the second plurality of clock signals between a ground reference and half of the power supply voltage.

9. The distribution network as recited in claim 5, wherein the reduced voltage swing clock generator is further configured to provide a voltage range for at least one of the second plurality of clock signals between half of the power supply voltage and the power supply voltage.

10. A method comprising:
providing a first plurality of non-overlapping clock signals;
transitioning a clock signal of at least one of a second plurality of clock signals from a first voltage level to an intermediate voltage level that is between a power supply voltage and a ground reference, in response to detecting a rising edge of a first one of the first plurality of clock signals;
preventing said clock level from reaching one of the power supply voltage or the ground reference by holding said clock signal at the intermediate voltage level for at least a pulse width of a second one of the first plurality of clock signals; and
transitioning said clock signal back to the first voltage level in response to a rising edge of a third one of the first plurality of clock signals.

11. The method as recited in claim 10, further comprising:
receiving the second plurality of clock signals in a latch;
holding an output data value in the latch, in response to receiving at least one of the second plurality of clock signals at the intermediate voltage level; and
transmitting a data input value through the latch, in response to receiving at least one of the second plurality of clock signals at the first voltage level.

12. The method as recited in claim 10, wherein a given pair of clock lines has equal loading capacitance.

13. The method as recited in claim 12, further comprising shorting together the given pair of clock lines during the pulse width of the second one of the first plurality of clock signals.

14. The method as recited in claim 13, further comprising storing a portion of a charge on each of the second plurality of clock lines on a respective ballast line for reuse later in a clock cycle.

15. The method as recited in claim 14, further comprising providing a voltage range for a first group of the second plurality of clock signals between a ground reference and half of the power supply voltage and for a second group of the second plurality of clock signals between half of the power supply voltage and the power supply voltage.

16. The method as recited in claim 14, wherein a first group of the second plurality of clock signals are the respective ballast lines for a second group of the second plurality of clock signals, wherein the first group are complement signals of the second group.

17. An apparatus comprising:
circuitry; and
a clock distribution network configured to provide at least one input clock to the circuitry;
wherein the circuitry includes:
an interface to the clock distribution network configured to receive an input clock from the clock distribution network;
a clock generator configured to provide a first plurality of clock signals based upon the received input clock; and
a reduced voltage swing clock generator, wherein the reduced voltage swing clock generator is configured to:
transition a clock signal of at least one of a second plurality of clock signals from a first voltage level to an intermediate voltage level that is between a power supply voltage and a ground reference, in response to detecting a rising edge of a first one of the first plurality of clock signals;
prevent said clock signal from reaching one of the power supply voltage or the ground reference by holding said clock signal at the intermediate voltage level for at least a pulse width of a second one of the first plurality of clock signals; and
transition said clock signal back to the first voltage level in response to detecting a rising edge of a third one of the first plurality of clock signals.

18. The apparatus as recited in claim 17, wherein a given pair of the second plurality of clock signals are on a pair of clock lines with a ratio of loading capacitance equal to a ratio of the intermediate voltage level to a difference between the intermediate voltage level and the power supply voltage.

19. The apparatus as recited in claim 18, wherein the given pair of clock lines is shorted together during the pulse width of the second one of the first plurality of clock signals.

20. The apparatus as recited in claim 19, wherein the reduced voltage swing clock generator is further configured to store a portion of an electrical charge on each of the given pair of clock lines on a respective ballast line for reuse later in a clock cycle.

21. The apparatus as recited in claim 19, wherein the first plurality of clock signals includes four non-overlapping clock signals, wherein each of the four non-overlapping clock signals is phase shifted 90 degrees from a phase of another of the four non-overlapping clock signals.

22. An integrated circuit comprising:
one or more sequential elements; and
a clock tree configured to provide one or more clock signals to each one of the one or more sequential elements;
wherein the clock tree includes:
a clock generator configured to provide a first plurality of clock signals;
a reduced voltage swing clock generator configured to receive the first plurality of clock signals, wherein the reduced voltage swing clock generator is configured to:
transition a clock signal of at least one of a second plurality of clock signals from a first voltage level to an intermediate voltage level that is between a power supply voltage and a ground reference, in response to detecting a rising edge of a first one of the first plurality of clock signals;
prevent said clock signal from reaching one of the power supply voltage or the ground reference by holding said clock signal at the intermediate voltage level for at least a pulse width of a second one of the first plurality of clock signals; and
transition said clock signal back to the first voltage level in response to detecting a rising edge of a third one of the first plurality of clock signals.

23. The integrated circuit as recited in claim 22, wherein a given pair of the second plurality of clock signals are on a pair of clock lines with a ratio of loading capacitance equal to a ratio of the intermediate voltage level to a difference between the intermediate voltage level and the power supply voltage.

24. The integrated circuit as recited in claim 23, wherein the given pair of clock lines is shorted together during the pulse width of the second one of the first plurality of clock signals.

25. The integrated circuit as recited in claim 24, wherein the reduced voltage swing clock generator is further configured to provide a voltage range for a first group of the second plurality of clock signals between a ground reference and half of the power supply voltage and for a second group of the second plurality of clock signals between half of the power supply voltage and the power supply voltage.

* * * * *